(12) United States Patent
Byun et al.

(10) Patent No.: US 6,844,761 B2
(45) Date of Patent: Jan. 18, 2005

(54) DLL WITH FALSE LOCK PROTECTOR

(75) Inventors: Sang Jin Byun, Daejeon (KR);
Beomsup Kim, Campbell, CA (US);
Chan-Hong Park, Seoul (KR)

(73) Assignee: Berkana Wireless, Inc., Campbell, CA (US)

( * ) Notice: Subject to any disclaimer, the term of this patent is extended or adjusted under 35 U.S.C. 154(b) by 6 days.

(21) Appl. No.: 10/437,417

(22) Filed: May 12, 2003

(65) Prior Publication Data

US 2004/0000937 A1 Jan. 1, 2004

Related U.S. Application Data

(63) Continuation of application No. 10/259,264, filed on Sep. 27, 2002, now abandoned.

(51) Int. Cl.[7] .................................................. H03L 7/06
(52) U.S. Cl. ...................................... 327/149; 327/158
(58) Field of Search ................................ 327/147, 149, 327/150, 153, 158, 159, 161, 162, 163

(56) References Cited

U.S. PATENT DOCUMENTS 5,712,582 A * 1/1998 Yokota et al. ............... 327/156
5,955,902 A * 9/1999 Takada et al. ............... 327/116

FOREIGN PATENT DOCUMENTS

| KR | 0005023 | 12/1989 | ........... F02D/41/34 |
| KR | 20000051784 | 8/2000 | ............. H03L/7/00 |

OTHER PUBLICATIONS

Foley, David J. and Flynn, Michael P., "CMOS DLL–Based 2–V 3.2–ps Jitter 1–GHz Clock Synthesizer and Temperature–Compensated Tunable Oscillator," IEEE Journal of Solid–State Circuits, vol. 36, No. 3, Mar. 2001.

Moon, Yongsan, et al, "An All–Analog Multiphase Delay–Locked Loop Using a Replica Delay Line for Wide–Range Operation and Low–Jitter Performance", IEEE Journal of Solid–State Circuits, vol. 35, No. 3, Mar. 2000.

* cited by examiner

Primary Examiner—Linh My Nguyen
(74) Attorney, Agent, or Firm—Van Pelt & Yi LLP

(57) ABSTRACT

A system and method are disclosed for providing a DLL with false lock protector to avoid false lock and ensure accurate lock. The false lock protector operates when the initial delay time between signals from an input reference clock and an output clock exceeds the lock range during operation of the DLL. The DLL with false lock protector includes a reference clock, a delay line composed of several delay cells connected in series, a phase detector, comparator for comparing phases of signals from the reference and output clocks, a determinator and a controller for controlling the delay of the delay line.

11 Claims, 9 Drawing Sheets

US 6,844,761 B2

DLL WITH FALSE LOCK PROTECTOR

CROSS REFERENCE TO RELATED APPLICATIONS

This application is a continuation of co-pending U.S. patent application Ser. No. 10/259,264, entitled DLL WITH FALSE LOCK PROTECTOR filed Sep. 27, 2002, now abandoned which is incorporated herein by reference for all purposes, which claims priority to Republic of Korea Patent Application No. KR10-2001-0060822, filed Sep. 28, 2001, which is incorporated herein by reference for all purposes.

FIELD OF THE INVENTION

The present invention relates generally to a delay locked loop. More specifically, a technique for false lock protection is disclosed.

BACKGROUND OF THE INVENTION

In general, a delay locked loop ("DLL") is a circuit that compares phases of the rising edges of signals from an input reference clock and an output clock through a phase detector ("PD"). FIG. 1 illustrates an embodiment of a conventional locked loop circuit for the general purpose described above. On the basis of the result of the comparison of the rising edges of the input reference clock and the output clock through a PD, a DLL implements control using a charge pump ("CP") and a capacitor (C), configured as shown. The delay time of the delay line includes several delay cells to match the rising edges of the input reference and output clocks.

When a DLL is used in a system that requires an accurate delay time, it is important that the delay time of the delay line be the same as a period T. If the actual initial delay time between the output clock and the input reference clock is less than 0.5T or larger than 1.5T, the DLL does not operate properly. The DLL's may fail to operate properly because the delay time of the delay line tends to be locked at 0 or nT (where n=2, 3, . . . ), respectively, due to the operational characteristics of a general phase detector ("PD"). A problem with conventional phase detectors is that because the delay time of delay cells used in an analog delay line may vary greatly depending on the control voltage, the delay time may be less than 0.5T or larger than 1.5T, resulting in inaccurate delay times.

FIG. 2 is another conventional implementation of a DLL showing a phase detector. A delay line (41) is composed of a number of unit delayers (d1-dn) and a phase detector (43). FIG. 3 is a further diagram of the phase detector shown in FIG. 2, which is composed of three flip-flops (61, 63, 65) and an end gate (67).

The phase detector (43) receives electrical impulses from the input reference clock (CLKIN) and the output clock (CLKOUT) of the delay line (41—FIG. 2) and a middle clock (CLKMID). The electrical signal can be selected from the two clocks (CLKIN, CLOUT) for comparison and the DLL will apply a control signal (VCON) to the delay line (41) through a charge pump circuit (45) on the basis of the result of such comparison, so that the delay line (41) may not be locked to a delay time of 2T. Conventional DLLs can prevent the delay line from being locked to a delay time of 2T, but cannot prevent locking to a higher delay time of nT (where n=3, 4, . . . ).

Another conventional DLL is shown in the block diagram of FIG. 4, including a replica delay line (41). A further illustration of the replica delay line (41) is shown in FIG. 5, which includes a clock (Ref-CLK). The clock and corresponding waveforms are illustrated in the diagram of FIG. 6. As illustrated in FIG. 6, a general DLL (40) is added with a replica delay line (41), wherein the replica delay line (41) tunes and sets the delay line within a correct lock range, while the DLL (40) provides for accurate control of delay time. Also, conventional operational methods for the replica delay line (41) shown in FIGS. 5 and 6 rely upon the probability that the replica delay line (41), using one delay cell and the delay time of one delay cell, being less than 1.5T is greater than the delay time of the entire delay line being less than 1.5T. However, conventional methods also have a drawback, requiring an additional DLL when the delay time of one delay cell is greater than 1.5T.

FIG. 7 is the diagram of yet another exemplary embodiment of a conventional DLL. As illustrated, a method uses the output ($\Phi 1-\Phi 9$) of each delay cell of the delay line (71) to determine whether the rising edge of the DLL output clock is within the correct lock range of a lock detector (72). The lock detector (72) latches the rising edge of the output of each delay cell to the input reference clock and determines a false lock using a combinational circuit. If the lock detector (72) determines a false lock, the phase detector (73) outputs an "up" or a "down" signal in accordance with the determination of the lock detector (72) regardless of the resulting value from a comparison of the phases between the rising edges of the input reference clock (ckref) and the output clock.

However, while conventional DLLs can avoid a false lock up to (m−1)T, when the delay line is composed of m delay cells, the delay line remains restricted to a delay time of nT (n=m, m+1, . . . ). Thus, there is a need for a DLL which is not restricted to a delay time of nT and which avoids the inaccurate delay times of conventional DLLs.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

A technique for a DLL with false lock protector that avoids the problems and inaccuracies associated with a false lock to 0 or nT (where n is 2 or a larger integer) as discussed above with regard to conventional DLL technologies is disclosed. Various embodiments of the present invention can ensure an accurate lock to a period T when an initial delay time between an input reference clock and an output clock exceeds a lock range.

Figure 8:
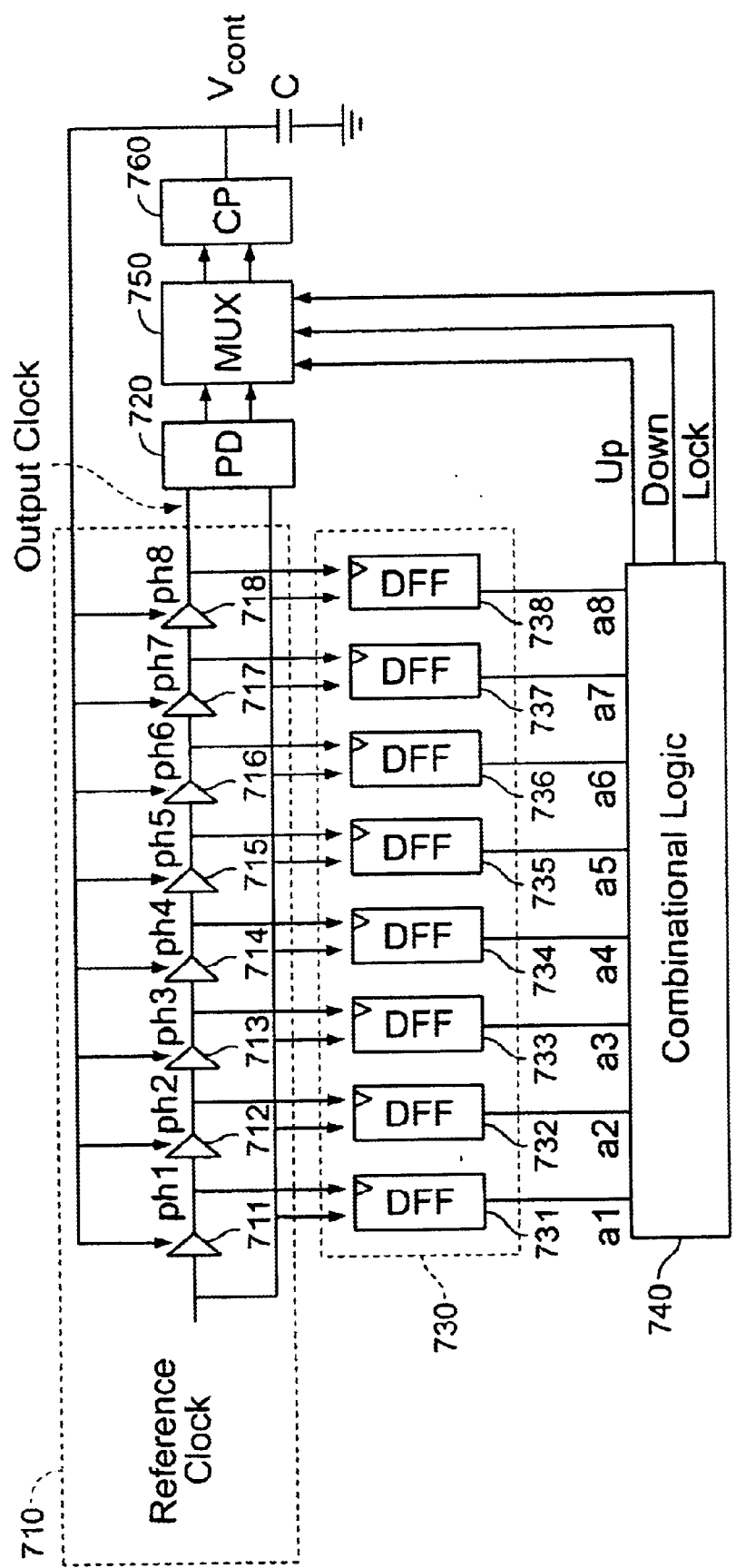
FIG. 8 is a block diagram of an exemplary DLL with false lock protector.

In accordance with one embodiment of the present invention as illustrated in FIG. 8, in order to enable an accurate lock to a period T, a phase detector that detects the phases of the reference clock and the output clock of the delay line. Accurate lock is enabled when an initial delay time between an input reference clock and an output clock exceeds a lock range, where the delay time is set by a delay line 710 that includes a number of delay cells connected in series. The detected phases of signals from the reference clock and the output clock of the delay are compared by a comparator that compares the order of the rising edges of signals from the output clock of each of the delay cells with the rising edges of signals from the reference clock and generates digital data. Also included is a determinator which determines on the basis of the digital data generated by the comparator, if the rising edge of the output clock of the delay line is a fast false lock range, a lock range, or a slow false lock range for the reference clock. A charge pump charges or discharges a capacitor (C) on the basis of the result of the phase comparison performed by the phase detector and the result of the determination of whether the output clock of the delay line is a fast false lock range, a lock range, or a slow false lock range for the reference clock. The charge pump also controls the amount of delay of the delay line in accordance with the amount of charge. Further descriptions of the present invention in various embodiments are provided in connection with FIGS. 8 through 13.

Figure 1:
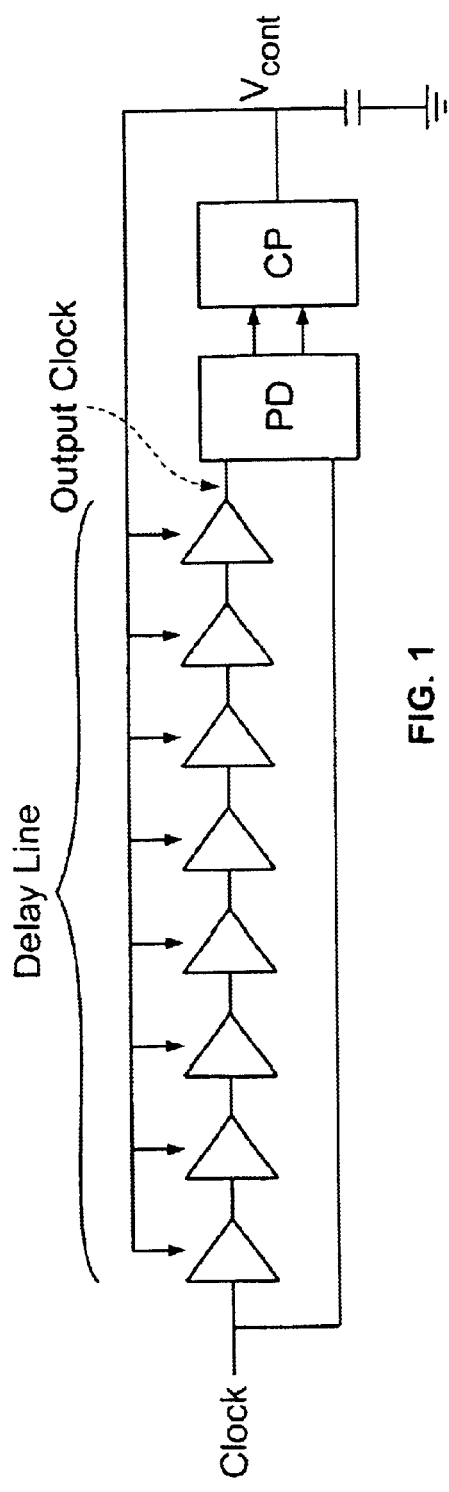
FIG. 1 is a block diagram of a general conventional DLL.
Figure 2:
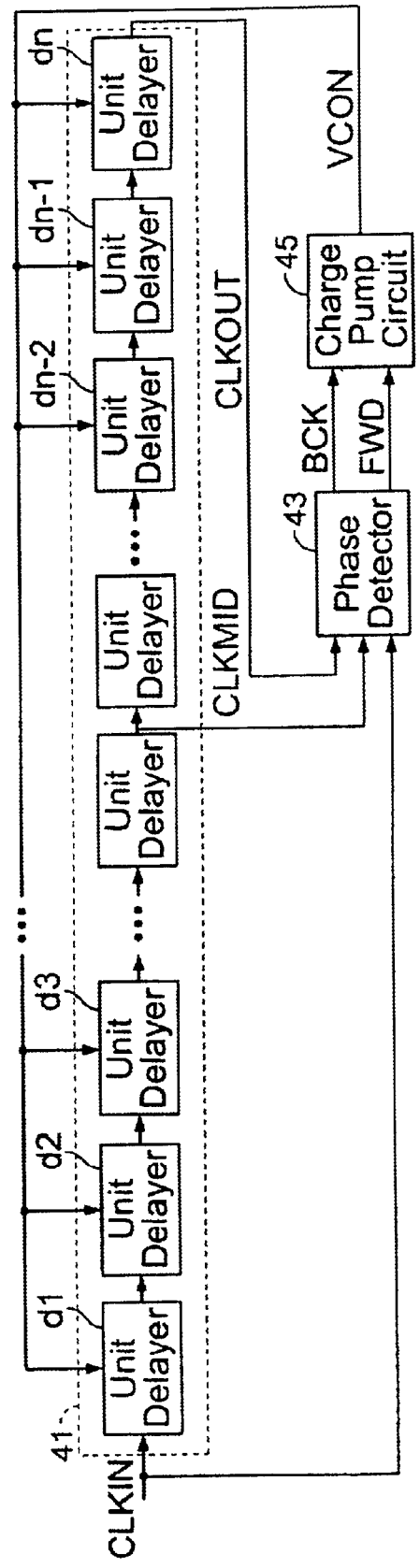
FIG. 2 is a block diagram of another exemplary conventional DLL.
Figure 3:
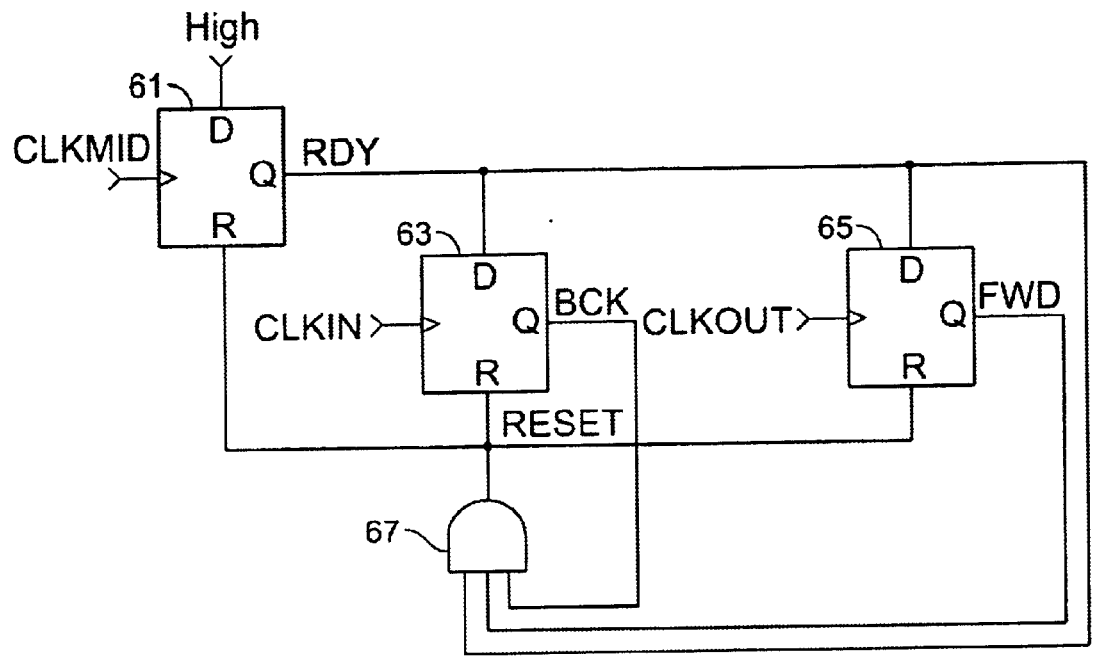
FIG. 3 is a detailed diagram of a phase detector, as shown in FIG. 2.
Figure 4:
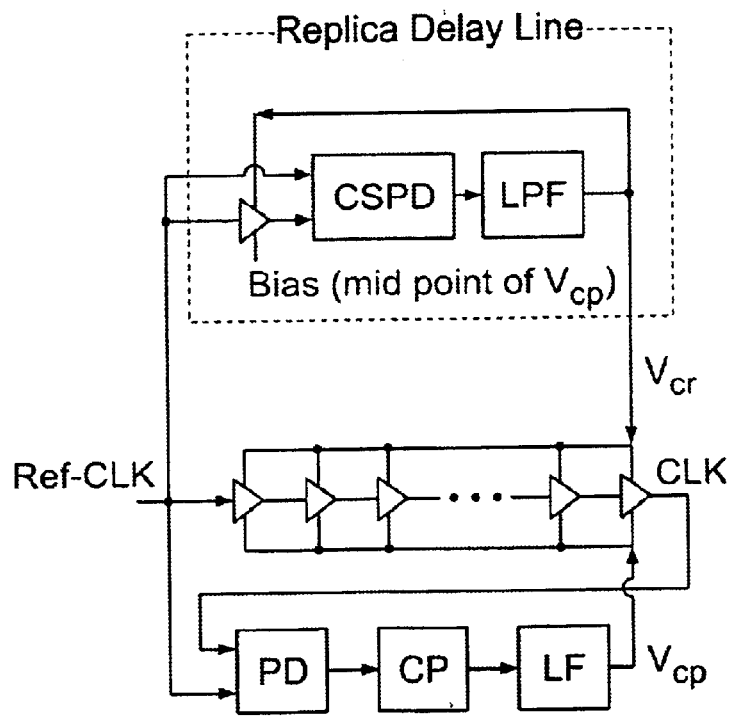
FIG. 4 is a block diagram of another exemplary conventional DLL.
Figure 5:
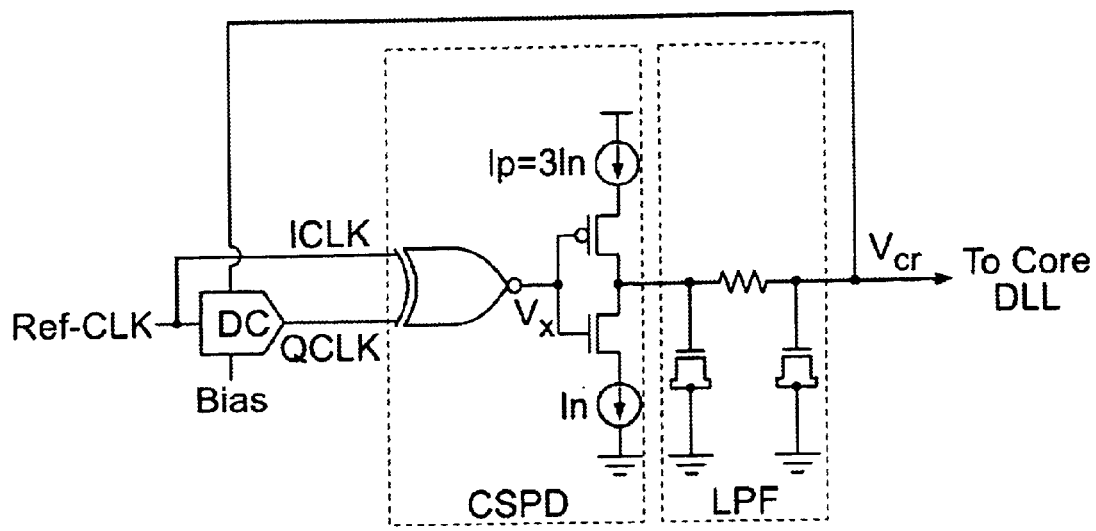
FIG. 5 is a detailed diagram of the replica delay line illustrated in FIG. 4.
Figure 6:
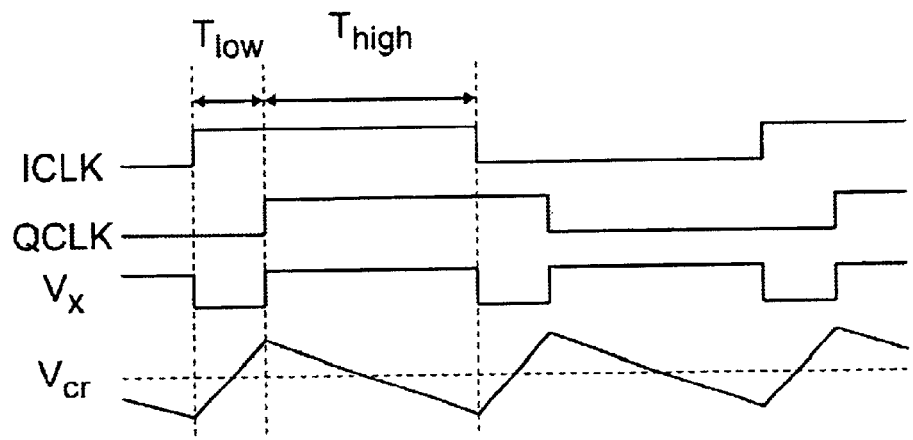
FIG. 6 is a diagram of the clock and the waveform of the replica delay line illustrated in FIG. 5.
Figure 7:
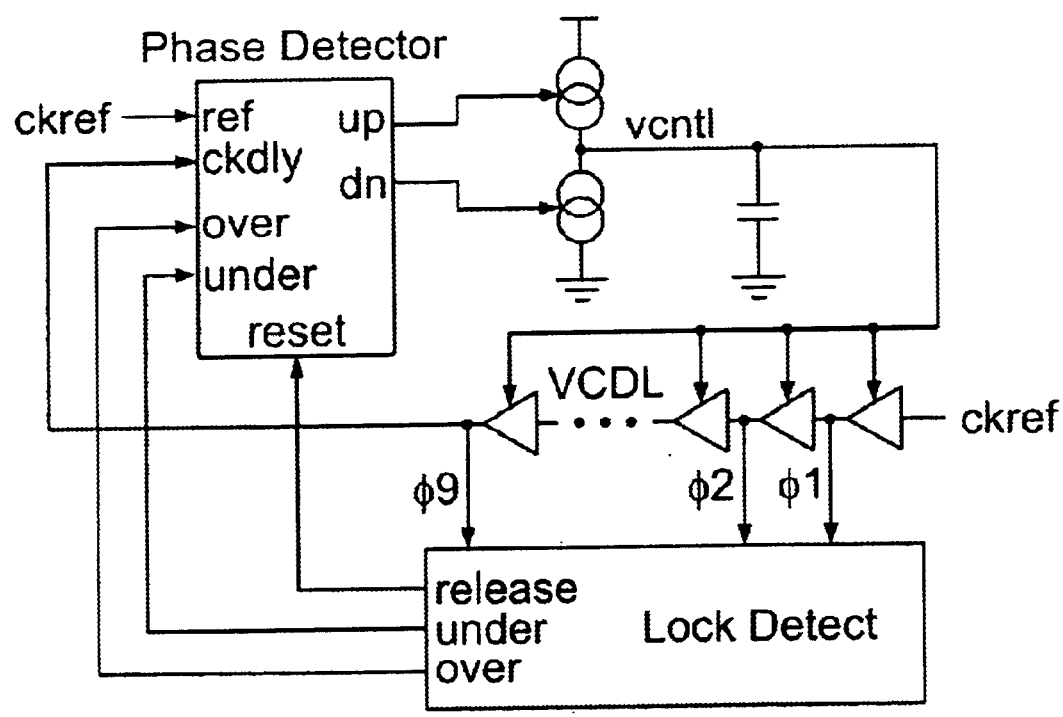
FIG. 7 is a diagram of an alternative embodiment of a conventional DLL.

FIG. 8 is a block diagram of a DLL with false lock protector in accordance with one embodiment of the present invention. A delay line 710 is shown including delay cells 711 through 718 which are connected in series. However, one of ordinary skill in the art may envision alternative embodiments where more or fewer delay cells are used. Also, alternative embodiments may include delay cells connected in a manner other than that illustrated in FIG. 7. In the embodiment shown, the delay line 710 delays the output of the input reference clock. A phase detector (PD) 720 detects the phases of the output clock of the delay line and the reference clock signals providing a basis for comparison. A comparator 730 is also included, housing delayed flip-flops (DFF) 731 through 738, although one of ordinary skill in the art may envision using more or fewer flip-flop gates. Each of the flip-flops 731 through 738 corresponds to one of the delay cells 711 through 718. The comparator 730 compares the rising edges of the output clocks ph1 through ph8 of each of the delay cells 711 through 718 and the rising edge of the reference clock and outputs digital data. A combinational logic module 740 calculates binary digital data a1 through a8, which is output from each DFF 731 through 738 of the comparator 730. The calculation of binary digital data is performed in accordance with a preset arithmetic expression and, on the basis of the calculation result, determines whether the rising edge of the output clock of the delay line 710, with regard to the reference clock, is a fast false lock range, lock range or slow false lock range. A MUX 750 multiplexes signals output from the phase detector (PD) 720 and the combinational logic module 740. A charge pump (CP) 760 charges or discharges a capacitor (C) in accordance with the multiplexed signal output from the MUX 750. Ultimately, the charged voltage of the capacitor (CP) is interpreted as a control signal which controls the amount of delay of the delay line 710.

In the above example, since the delay line 710 is composed of eight delay cells 711 through 718, the output clocks ph1 through ph8 of each delay cell 711 through 718 passes through each of the DFFs 731 through 738 of the comparator 730. The input of both signals from the output clocks ph1 through ph8 and the reference clock enables the detection of signal edges. These detected signal edges and Boolean variables a1 through a8 are output from the comparator 730 as binary digital data from the individual DFFs 731 through 738. Subsequently, the output binary digital from the individual DFFs 731 through 738 are provided as inputs to the combinational logic module 740 and used in calculations generated on the basis of preset mathematical expressions 1 through 3 below, according to one embodiment of the present invention.

$$\text{up} = a_1 a_2 a_3 a_4 a_5 a_6 a_7 \qquad \text{[Mathematical Expression 1]}$$

$$\text{down} = a_1 a_2 \overline{a_3} + a_1 \overline{a_2} \qquad \text{[Mathematical Expression 2]}$$

$$\overline{\text{lock}} = \text{up} + \text{down} \qquad \text{[Mathematical Expression 3]}$$

Figure 9:
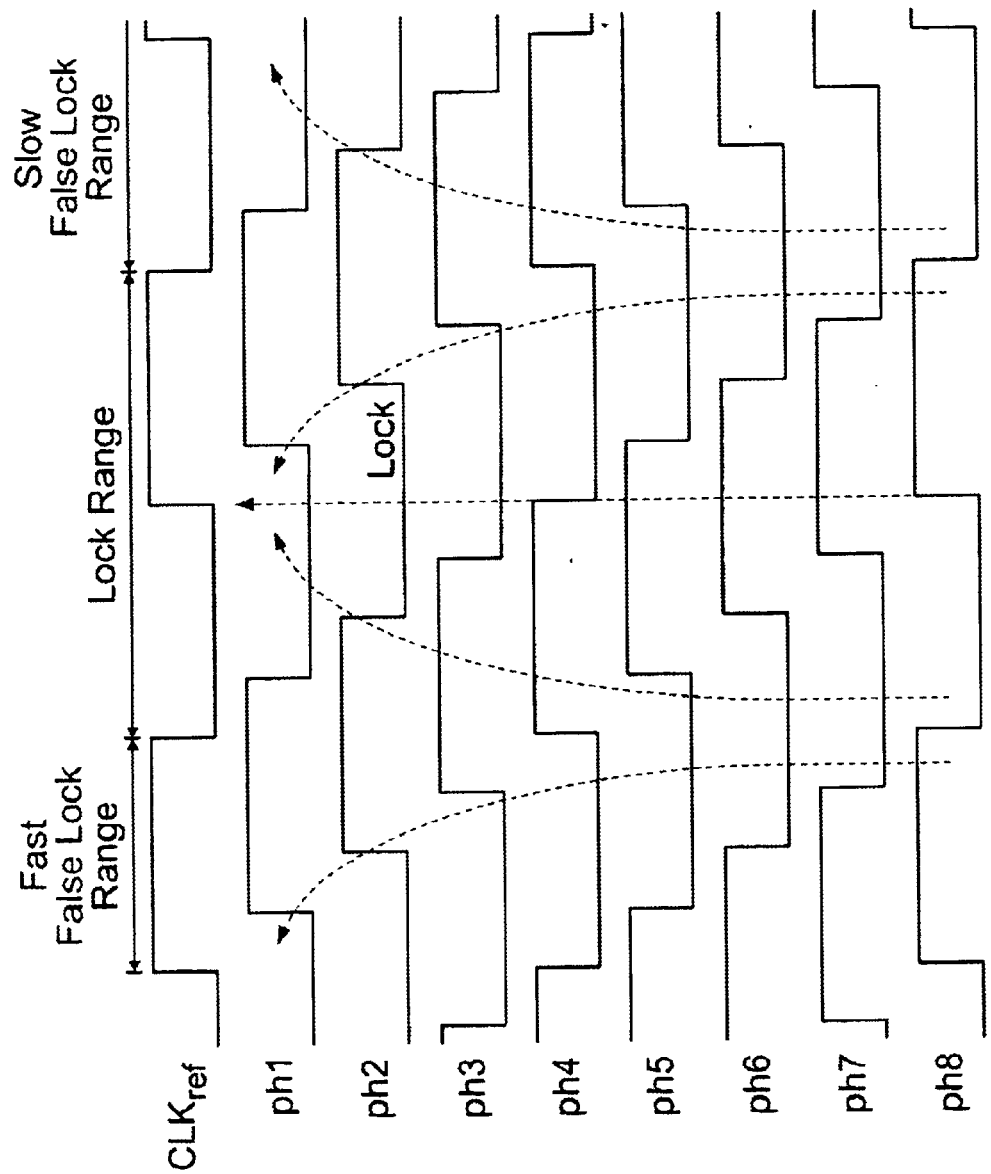
FIG. 9 is an exemplary clock timing diagram of a reference clock (CLKref) and outputs (ph1–ph8) for each delay cell of a delay line, as shown in FIG. 8.

According to one embodiment of the present invention, the calculation method of the combinational logic module 740 is described in further detail in conjunction with FIG. 9. If "up=1" is the indicated result in mathematical expression 1, described above, the result indicates that the rising edge of the output clock falls within the fast false lock range (a range of less than 0.5T). Thus, a corresponding "up" signal should be sent to the charge pump 760 regardless of the output of the phase detector 720. The "up" signal increases the delay time of the delay line 710 to enable the rising edge of the reference clock signal to be adjusted to within the lock range.

Referring to mathematical expression 2 above, if "down=1" is the indicated result, the rising edge of the output clock may fall within the slow false lock range. Subsequently, a "down" signal should be sent to the charge pump 760, regardless of the output of the phase detector 720, in order to decrease the delay time of the delay line 710. The shortened delay time enables the rising edge of the output clock to be adjusted to within the lock range, for example, the slow false lock range.

Also referring to mathematical expression 2 above, if "lock=1" is the calculated result of the above mathematical expression 3, then the resulting expressions of "up=0" and "down=0" are meant to indicate that the rising edge of the output clock is correctly within the lock range. Thus, the charge pump 760 should charge or discharge in accordance with the output of the phase detector 720.

Figure 10A:
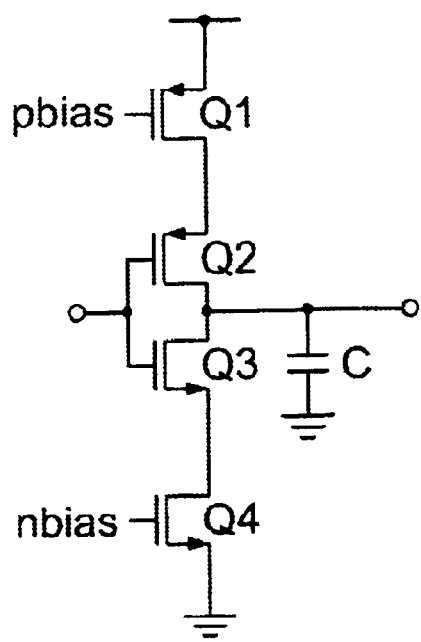
FIG. 10 is an exemplary diagram of the delay cell.
Figure 10B:
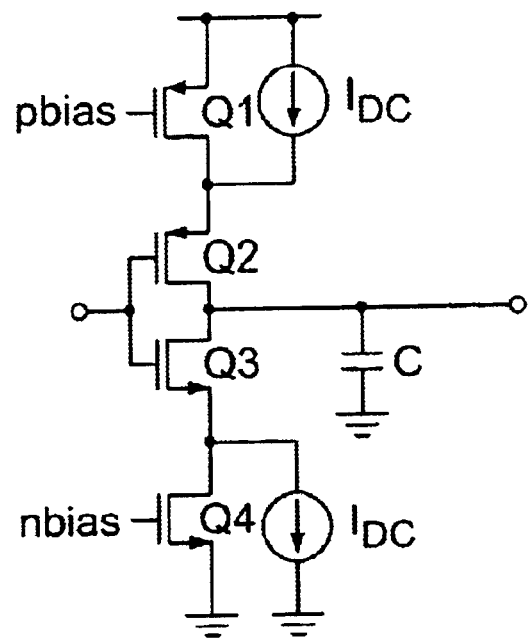

FIG. 10(a) refers to an existing delay cell that is composed of four FETs (Q1–Q4) connected in series and a capacitor (C) connected between the FETs (Q2, Q3) and the ground. DC current sources (IDC) are included between a source and a drain of the FETs (Q1, Q4), as illustrated in FIG. 10(b).

Figure 11:
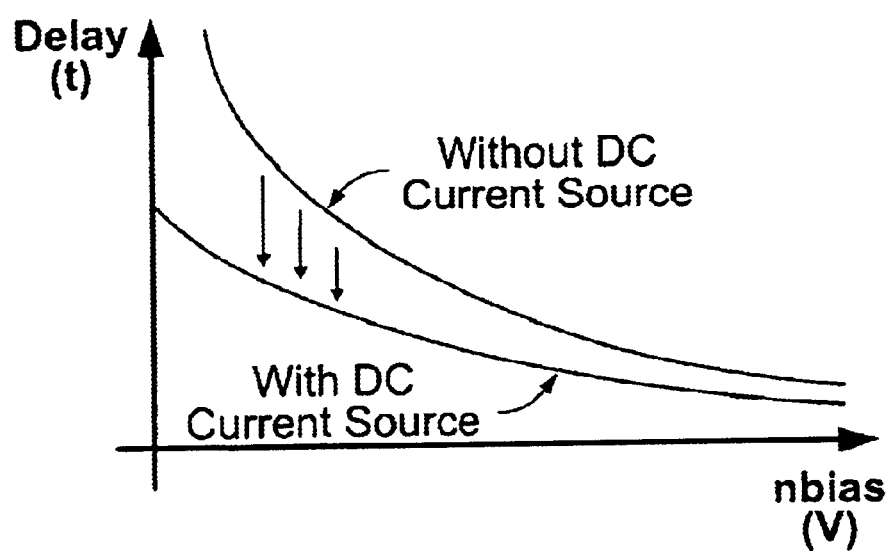
FIG. 11 is a graph showing an exemplary relationship between the voltage applied in a delay cell and a delay time, as shown in FIG. 10.

FIG. 11 is a graph illustrating the relationship between delay (t) and bias (V), in accordance with an embodiment of the present invention. The relationship illustrated in FIG. 11 can be used to set an upper limit of the delay time for the delay line 710 (FIG. 8), so that the range to which the DLL may be locked can be limited to "nT" (where n<M). As an example, if M=5, the upper limit of the delay time for the delay line can be applied by the DC current sources for nT (where n=5, 6, . . . ) or by the false lock protector for nT (where n=0, 2, 3, 4) so that the delay time of the DLL will be accurately set to T.

Figure 12:
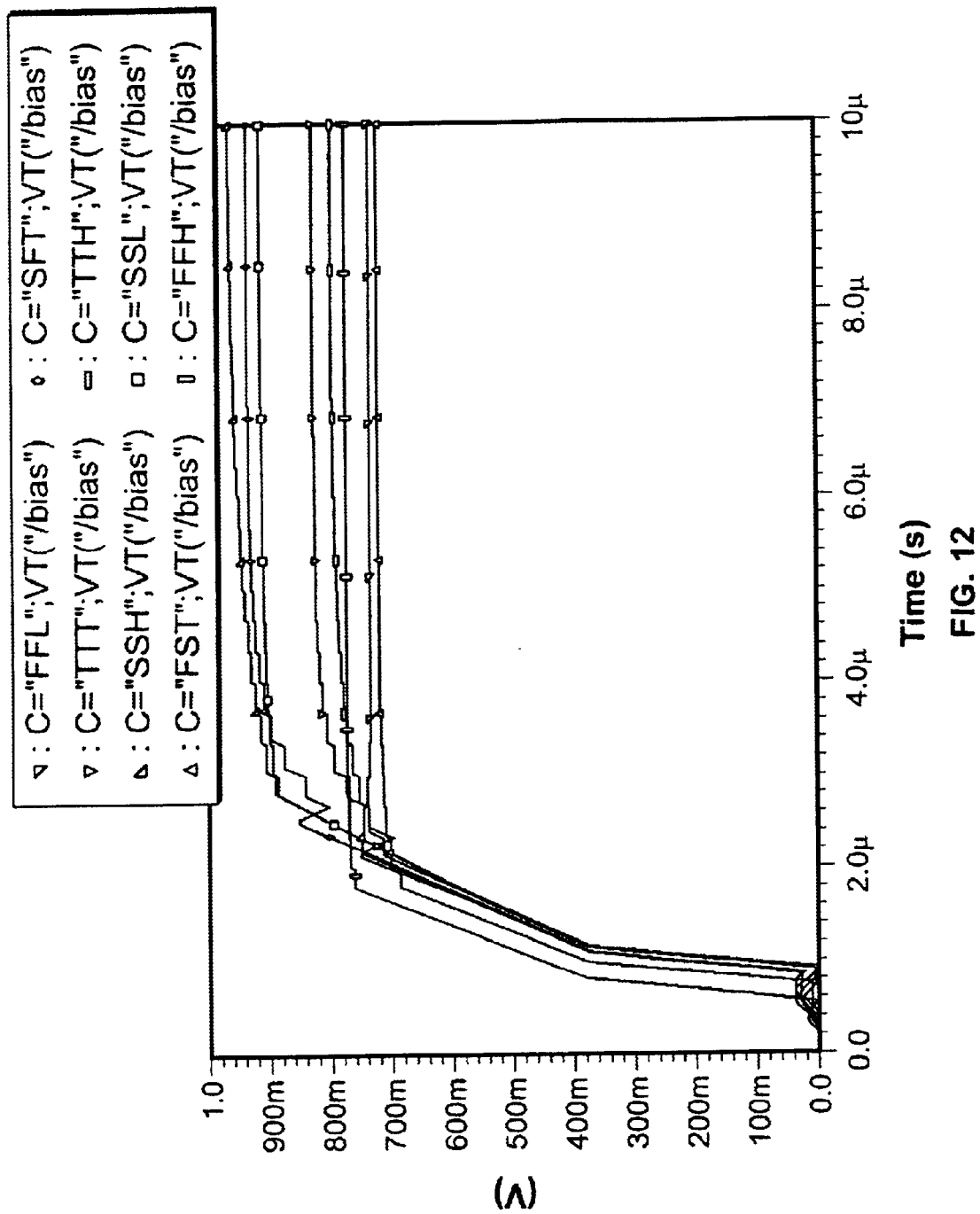
FIG. 12 is a graph of simulated results for an embodiment of the present invention.

FIG. 12 is another graph illustrating simulated results for one embodiment of the present invention. FIG. 12 illustrates the results of transient simulation where the delay control voltage (Vcont) of the DLL is locked. The delay control voltage (Vcont) approaches the lock range quickly for the first 2 microseconds due to the false lock protection aspect of the present invention. The false lock protection aspect of the present invention uses the comparator 730 and the combinational logic module 740 to determine whether the initial delay time of the delay line is more than 1.5T outside (+/−) of the lock range. Accordingly, the combinational logic module 740, instead of the phase detector 720, sends a "down" signal to the charge pump 760 which, in response, charges the capacitor (C). The power supply voltage (VDD) is raised from 0V to 1.8V in the first 1□ and then kept at 1.8V for 8 corner simulations (TTT, TTH, FFH, FFL, SSH, SSL, FST, SFT). In accordance with one embodiment of the present invention, the DLL can quickly react to changes in the rising edges of the output clock, when compared to the reference clock. The rapid reaction thus enables the achievement of rapid and accurate signal lock, while protecting against false lock.

Figure 13:
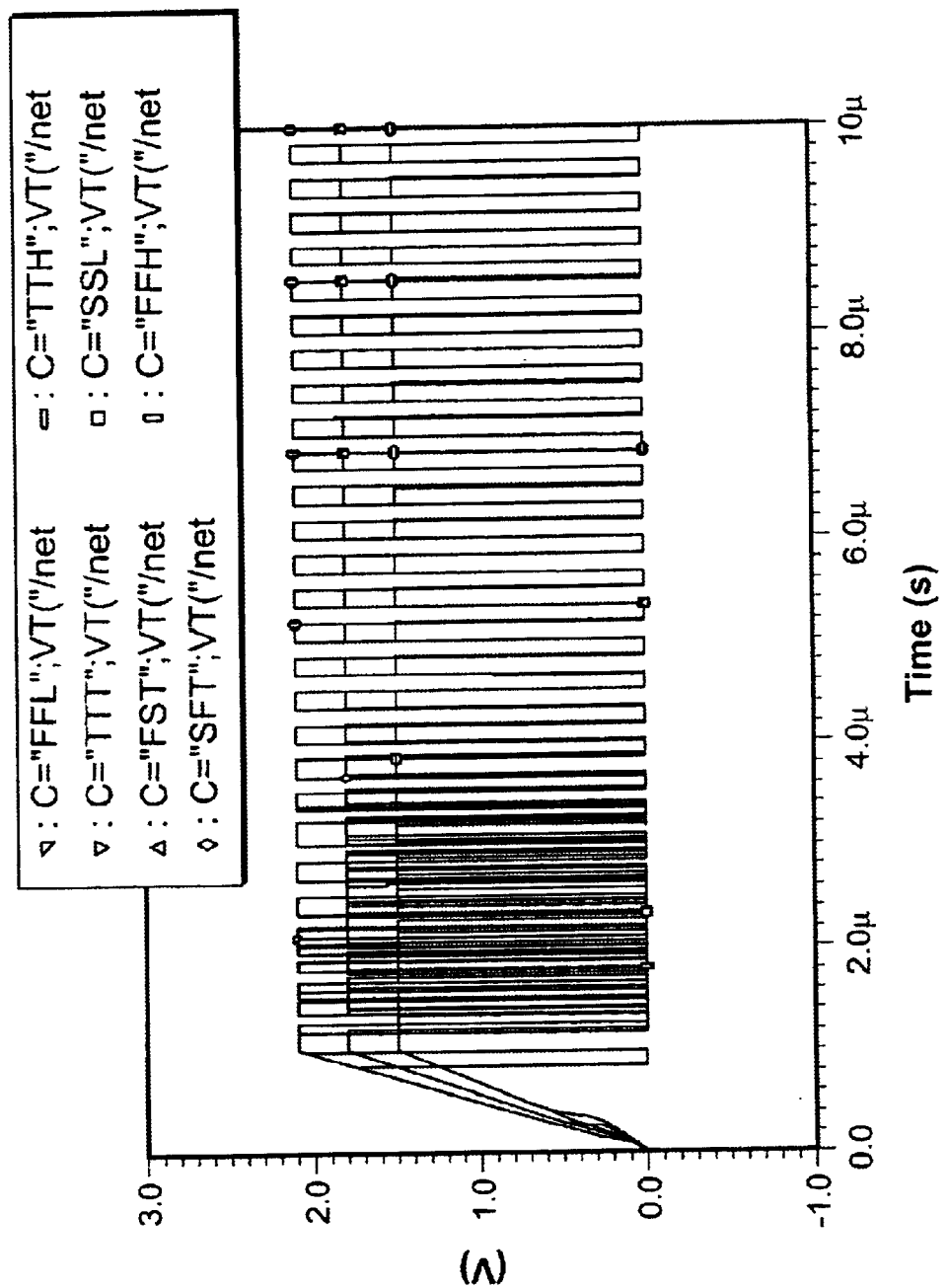
FIG. 13 is a graph of simulated results for an embodiment of the present invention.

FIG. 13 is also a graph of the simulated results yielded by an embodiment of the present invention. FIG. 13 shows the output clock waveform of the DLL during the transient simulation where the delay control voltage (Vcont) of the DLL is locked.

As described in detail in the above, the DLL with false lock protector, in accordance with the above-described embodiments of the present invention, locks the delay time to the period T accurately and quickly without being locked to 0 or nT (where n is 2 or a larger integer) even when the initial delay time between the input reference clock and the output clock exceeds the lock range.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A delay locked loop for false lock protection comprising:

a reference clock sending a first signal;

a delay line for delaying the first signal and sending a second signal to an output clock;

a phase detector for detecting a phase in the first signal and the second signal;

a comparator for comparing an order of a rising edge of the second signal with a rising edge of the first signal and generating output data;

a determinator, using the output data from the comparator, for determining a range to be associated with the rising edge of the second signal, with regard to the reference clock; and a controller for controlling the delay line using the phase detector and the output data from the comparator and the range determined by the determinator.

2. The delay locked loop of claim 1 wherein the range is a fast false lock range.

3. The delay locked loop of claim 1 wherein the range is a lock range.

4. The delay locked loop of claim 1 wherein the range is a slow false lock range.

5. The delay locked loop of claim 1 wherein the controller further comprises:

a capacitor for storing a charge, wherein the charge determines an amount of delay in the first signal; and a charge pump for charging or discharging the capacitor, wherein the charging or discharging is based on the output data and the range.

6. The delay locked loop of claim 1 wherein the comparator is further comprised of a delayed flip-flop.

7. The delay locked loop of claim 1 wherein the determinator generates a discharge control signal to discharge the capacitor if $a_1 a_2 \ldots a_n = 1$, wherein $a_1, a_2, \ldots a_n$ are binary digital output data from the comparator.

8. The delay locked loop of claim 1 wherein the determinator generates a charge control signal to charge the capacitor if $a_1 a_2 \ldots \bar{a}_n + a_1 \ldots \bar{a}_{n-1} = 1$, wherein $a_1, a_2, a_3, \ldots, a_{n-1}, a_n$ are binary digital output data from the comparator.

9. The delay locked loop of claim 1 wherein the determinator generates a charge and discharge control signal to charge/discharge the capacitor if $[(a_1 a_2 \ldots a_n) + (a_1 a_2 \ldots \bar{a}_n + a_1 \ldots \bar{a}_{n-1})] = 1$, wherein $a_1, a_2, a_3, \ldots, a_{n-1}, a_n$ are binary digital output data from the comparator.

10. The delay locked loop of claim 1 wherein the delay cell further comprises:

two or more transistors connected in series;

a current source connected between a source and a drain of each of the transistors; and a capacitor connected between a common point of the two or more transistors and a ground.

11. A method for a delay locked loop for false lock protection comprising:

sending a first signal from a reference clock;

delaying the first signal using a delay line and sending a second signal to an output clock;

detecting a phase, using a phase detector, in the first signal and the second signal;

comparing an order of a rising edge of the second signal with a rising edge of the first signal and generating output data;

determining a range to be associated with the rising edge of the second signal, with regard to the reference clock; and controlling the delay line using the phase detector and the output data from the comparing and the range.

* * * * *